(12) United States Patent
Shionoiri et al.

(10) Patent No.: US 7,923,796 B2
(45) Date of Patent: Apr. 12, 2011

(54) SEMICONDUCTOR DEVICE INCLUDING RESONANCE CIRCUIT

(75) Inventors: Yutaka Shionoiri, Isehara (JP);
Tomoaki Atsumi, Isehara (JP); Hiroki Inoue, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1357 days.

(21) Appl. No.: 11/440,030

(22) Filed: May 25, 2006

(65) Prior Publication Data

US 2006/0267771 A1    Nov. 30, 2006

(30) Foreign Application Priority Data

May 27, 2005  (JP) ................................. 2005-156108

(51) Int. Cl.
*H01L 27/14* (2006.01)
*G08B 13/14* (2006.01)
(52) U.S. Cl. ..................... 257/428; 340/572.5
(58) Field of Classification Search .................. 257/379, 257/428

See application file for complete search history.

(56) References Cited

U.S. PATENT DOCUMENTS

| 4,069,472 | A  | * | 1/1978  | Kamata et al. ................. 342/44 |
| 5,721,517 | A  |   | 2/1998  | Goma et al. |
| 7,471,164 | B2 | * | 12/2008 | Reimann .................... 331/177 V |
| 2005/0261797 | A1 | * | 11/2005 | Cyr et al. ...................... 700/121 |
| 2006/0154617 | A1 | * | 7/2006  | Clingman et al. .............. 455/78 |

FOREIGN PATENT DOCUMENTS

| JP | 07-273544   | 10/1995 |
| JP | 2002-246829 | 8/2002  |

* cited by examiner

*Primary Examiner* — W. David Coleman
(74) *Attorney, Agent, or Firm* — Eric J. Robinson; Robinson Intellectual Property Law Office, P.C.

(57) ABSTRACT

It is an object of the present invention to provide a semiconductor device in which an arrangement area of capacitance can be reduced and resonance frequency can be easily adjusted. The semiconductor device includes an antenna and a resonance circuit including a capacitor connected to the antenna in parallel where the capacitor is formed by connecting x pieces of first capacitor (x is an arbitrary natural number), y pieces of second capacitor (y is an arbitrary natural number), and z pieces of third capacitor (z is an arbitrary natural number) in parallel; and the first capacitor, the second capacitor, and the third capacitor have different capacitance values from each other. It is preferable that each of the first capacitor, the second capacitor, and the third capacitor be a MIS capacitor. Further, at least one of the first capacitor, the second capacitor, and the third capacitor is preferably formed by connecting a plurality of capacitors in parallel.

9 Claims, 13 Drawing Sheets

111 111 112 113 113 113 113 113
105

111 111 112 113 113 113 113 113 113 113
105

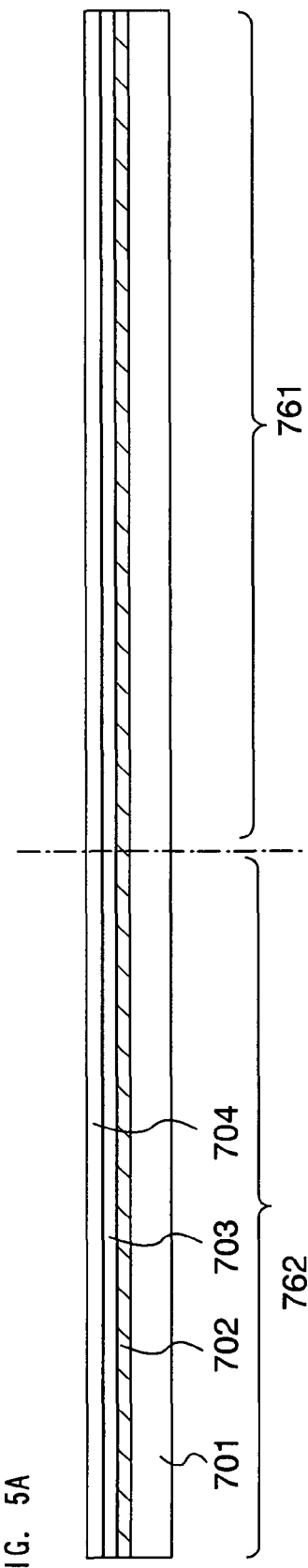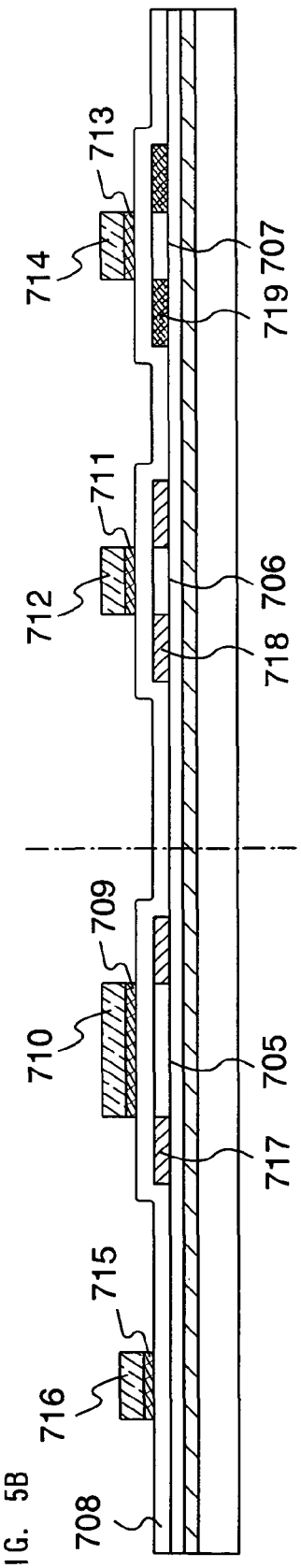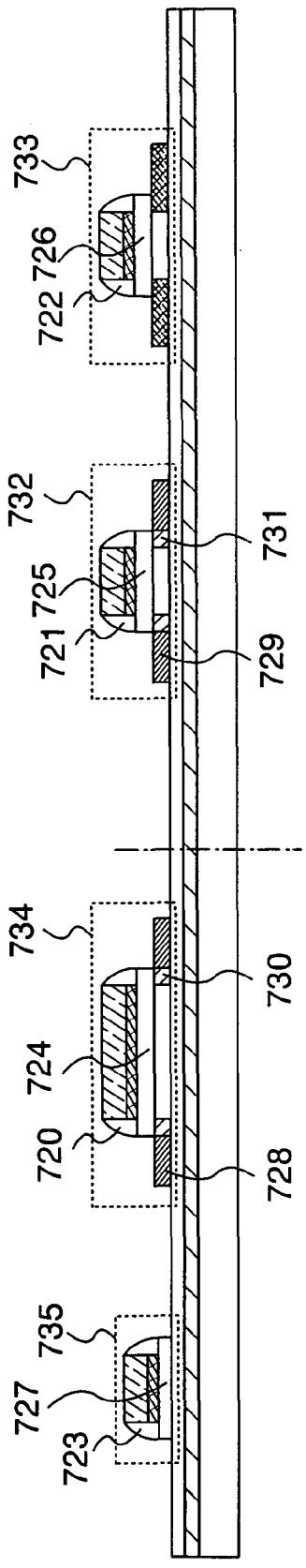

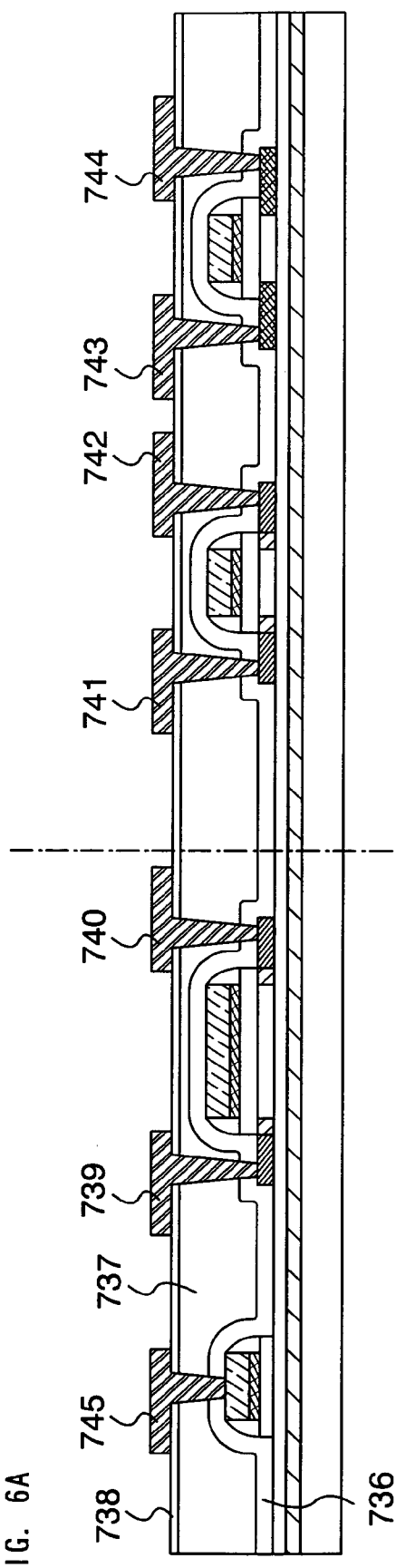
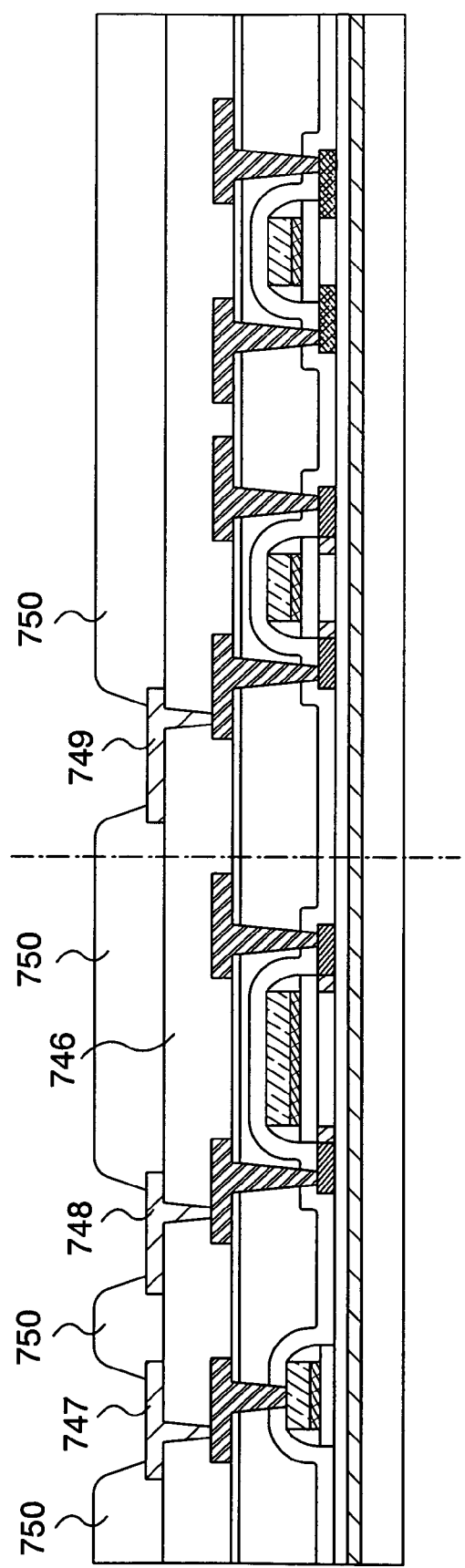
FIG. 6A
FIG. 6B

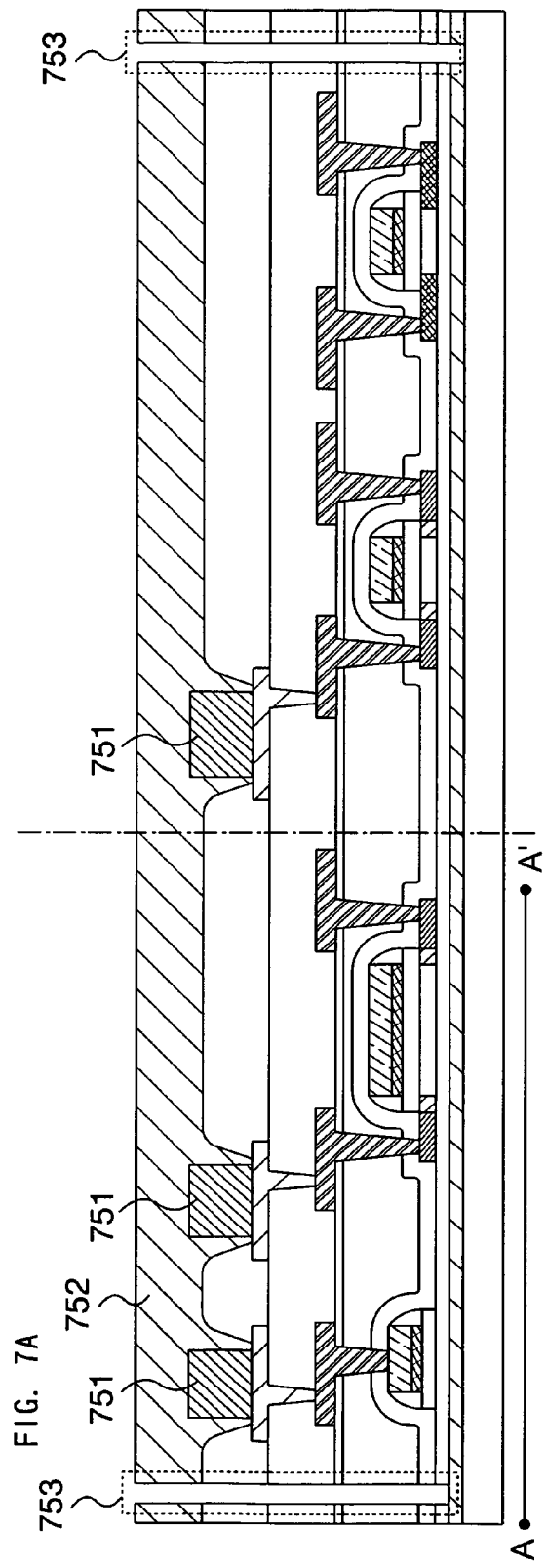
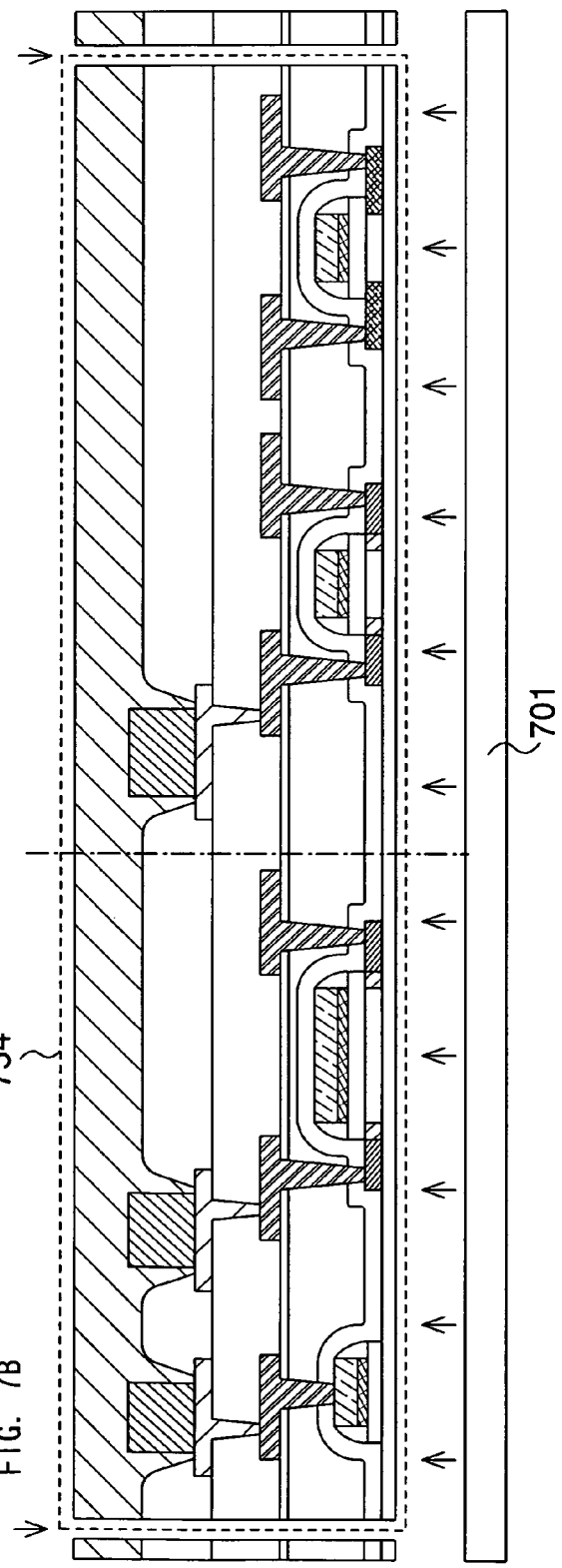

SEMICONDUCTOR DEVICE INCLUDING RESONANCE CIRCUIT

BACKGROUND OF THE INVENTION

1. Field of the Invention

The present invention relates to a semiconductor device having a resonance circuit. The present invention also relates to a semiconductor device capable of transmitting and receiving data by wireless communication.

2. Description of the Related Art

In recent years, an environment where information network can be accessed at any time in any situations, which is referred to as a ubiquitous information society, has been facilitated. In such an environment, individual recognition technology has attracted attention. For example, there is technology that can be used for production, management, and the like, in which a history of an object is clarified by giving an ID (an individual recognition code) to an individual object. Above all, a semiconductor device capable of transmitting and receiving data by wireless communication is beginning to be utilized In a semiconductor device of a transmitter/receiver, which can, for example, record and erase data by transmitting and receiving data without contact, antennas are arranged and resonance frequency is determined in advance so that an electromagnetic wave is made to intervene between this semiconductor device having a structure in which integrated circuits are mounted on the antenna and a reader/writer device to be able to transmit and receive data.

Conventionally, in order to obtain the predetermined resonance frequency, in a semiconductor device, capacitance is provided by stacking a plurality of plate-shaped conductors over a main body of an antenna over the semiconductor device through an insulator. An end of one conductive line of which another end is connected to the plurality of the plate-shaped conductors, is connected to the main body of the antenna of the semiconductor device. A leading portion, to which the plurality of the plate-shaped conductors of the conductive line is connected, is provided in a portion not in a perpendicular direction, which extends from the main body of the antenna of the semiconductor device and is not overlapped or underlapped with the main body of the antenna. The leading portion of the conductive line is divided to adjust the capacitance, and then, the predetermined resonance frequency is obtained (for example, see Patent document 1; Japanese Patent Application Laid-Open No. 2002-246829).

SUMMARY OF THE INVENTION

As conventional capacitance of the semiconductor device, a parallel plate-type structure in which plate-shaped conductors are stacked over the antenna of the semiconductor device through an insulator (hereinafter, referred to as a parallel plate capacitor 1), a parallel plate-type structure in which plate-shaped conductors are stacked over the plate-shaped conductors through an insulator (hereinafter, referred to as a parallel plate capacitor 2), or the like is employed.

However, when capacitance of the semiconductor device is formed with the use of the plate-shaped conductors, an arrangement area becomes wide; therefore, a defect is caused in the case of examining miniaturization of the semiconductor device.

Further, when capacitance of the semiconductor device is formed by only an equivalent capacitance value, a trouble is caused in a case where capacitance is adjusted by a value that is equal to or less than the capacitance value and fine adjustment of the capacitance frequency is necessary. In a similar way, when capacitance of the semiconductor device is formed by only an equivalent capacitance value, a trouble is caused also in a case where capacitance is adjusted by a value that is equal to or more than the capacitance value and rough adjustment of the capacitance frequency is necessary.

Accordingly, it is an object of the present invention to provide a semiconductor device in which an arrangement area of capacitance can be reduced and capacitance frequency can be easily adjusted.

In a semiconductor device of the present invention, capacitance of the semiconductor device is formed by arranging a plurality of MIS capacitors that have different magnitude (a capacitance value [pF]) from each other. Then, a wiring of the MIS capacitors, which form the capacitance of the semiconductor device, is disconnected to be separated from the entire capacitance of the semiconductor device; therefore, a capacitance value can be reduced to obtain the desired resonance frequency. In a plurality of capacitors, capacitors having the same magnitude may be included. For example, a semiconductor device may have a structure in which x pieces of capacitor (x is an arbitrary natural number) of which a capacitance value is $C_1$ [pF], y pieces of capacitor (y is an arbitrary natural number) of which a capacitance value is $C_2$ [pF], and z pieces of capacitor (z is an arbitrary natural number) of which a capacitance value is $C_3$ [pF] are arranged. It is to be noted that the MIS capacitor has a structure in which an insulator is interposed between an electrode made of a metal and a semiconductor layer. Here, it is preferable to use silicon oxide, silicon nitride, or the like for an insulator. However, an insulator is not limited to the one described here, and another insulator having high dielectric constant or the like may be used. Further, each capacitor may be divided into further small capacitors. Each of the capacitors divided into further small capacitors may be connected in parallel or connected in series.

A semiconductor device of the present invention has a structure in which capacitance is formed by arranging a plurality of MIS capacitors having different capacitance values from each other, and disconnecting a wiring of the MIS capacitors having different capacitance value from each other, which form the capacitance of the semiconductor device, to be separated from the entire capacitance of the semiconductor device; therefore, a capacitance value can be adjusted finely or roughly to easily obtain the desired resonance frequency.

$$f = \frac{1}{2\pi\sqrt{LC}} \quad (1)$$

In the formula (1), f is resonance frequency, L is inductance of a coil, and C is resonance capacity.

A MIS capacitor forming capacitance of a semiconductor device of the present invention forms a parallel plate-type capacitor (hereinafter, referred to as a MIS capacitor) because an electrode and a semiconductor layer, which are formed with a gate electrode, are confronted with each other with an insulator interposed therebetween. A distance between the electrode and the semiconductor layer, which are formed with the gate electrode, can be easily made to be shorter than a distance between plate-shaped conductors such as a parallel plate capacitor 1 and a parallel plate capacitor 2. Therefore, it becomes possible to make an arrangement area narrower by using a MIS capacitor rather than by using the parallel plate capacitor in a case of forming capacitance of which a capacitance value is equivalent.

$$C = \epsilon_s \times \epsilon_o \times S/d \quad (2)$$

In the formula (2), C is a capacitance value, $\epsilon_s$ is relative dielectric constant, $\epsilon_o$ is dielectric constant in vacuum, S is an area, and d is a distance. Since d of a MIS capacitor can be easily shortened as compared to d of the parallel plate capacitor 1, the parallel plate capacitor 2, and the like, an area S can be reduced by using a MIS capacitor rather than the parallel plate capacitor in a case where a value of capacitance C is made to be equivalent in the MIS capacitor; and the parallel plate capacitor 1, the parallel plate capacitor 2, and the like.

Hereinafter, a structure of a semiconductor device of the present invention will be specifically described.

According to an aspect of the present invention, a semiconductor device includes an antenna and a resonance circuit including a capacitor connected to the antenna in parallel where the capacitor is formed by connecting a plurality of capacitors in parallel. The semiconductor device has a feature that at least one capacitor selected from the plurality of the capacitors is electrically separated from the capacitor of the resonance circuit so that a capacitance value of the capacitor of the resonance circuit is adjusted. Further, it is preferable that at least one of the capacitors connected in parallel has a different capacitance value from that of the other capacitors. It is preferable that each of the plurality of the capacitors be a MIS capacitor.

According to another aspect of the present invention, a semiconductor device includes an antenna and a resonance circuit including a capacitor connected to the antenna in parallel where the capacitor is formed by connecting x pieces of first capacitor (x is an arbitrary natural number), y pieces of second capacitor (y is an arbitrary natural number), and z pieces of third capacitor (z is an arbitrary natural number) in parallel; and the first capacitor, the second capacitor, and the third capacitor have different capacitance values from each other. In addition, in the semiconductor device, at least one capacitor selected from x pieces of the first capacitor, y pieces of the second capacitor, and z pieces of the third capacitor is electrically separated from the capacitor of the resonance circuit so that a capacitance value of the capacitor of the resonance circuit is adjusted.

It is preferable that each of the first capacitor, the second capacitor, and the third capacitor be a MIS capacitor. Further, it is preferable that at least one of the first capacitor, the second capacitor, and the third capacitor be formed by connecting a plurality of capacitors in parallel. In other words, the first to third capacitors are formed by one capacity element, or by a circuit in which a plurality of capacity elements are connected in parallel. A capacitor for fine adjustment of resonance capacity may be formed by a capacity element with a small capacitance value. A capacitor for rough adjustment of the resonance capacity may be formed by connecting a plurality of capacity elements in parallel to increase a capacitance value thereof.

According to another aspect of the present invention, a semiconductor device includes a resonance circuit including an antenna, a capacitor, and first and second wirings where the capacitor is formed by connecting a plurality of capacitors having different capacitance value in parallel; each of the plurality of the capacitors is formed with an insulating layer interposed between a semiconductor layer and a conductive layer; the semiconductor layer is electrically connected to the antenna through the first wiring; and the conductive layer is electrically connected to the antenna through the second wiring. In addition, the semiconductor device has a feature that at least one capacitor selected from the plurality of the capacitors is electrically separated from the capacitor of the resonance circuit so that a capacitance value of the capacitor of the resonance circuit is adjusted. In the present invention, a method for removing a wiring by laser irradiation, etching and the like may be used for separating the capacitor.

By implementing the present invention, a semiconductor device in which resonance frequency can be easily adjusted to be the desired frequency can be obtained. Further, by implementing the present invention, a semiconductor device in which an occupation area of a capacitor is reduced for high-definition can be obtained.

BRIEF DESCRIPTION OF DRAWINGS

FIGS. 5A to 5C are views for describing a mode of a method for manufacturing a semiconductor device of the present invention;

FIGS. 6A and 6B are views for describing a mode of a method for manufacturing a semiconductor device of the present invention;

FIGS. 7A and 7B are views for describing a mode of a method for manufacturing a semiconductor device of the present invention;

DETAILED DESCRIPTION OF THE INVENTION

Embodiment modes of the present invention will be described below. However, the invention can be implemented in many various ways and it is to be easily understood that various changes and modifications will be apparent to those skilled in the art, unless such changes and modifications depart from the content and the scope of the invention. Therefore, the present invention is not construed as being limited to the description of the following Embodiment modes.

Embodiment Mode 1

One mode of the present invention will be described with reference to FIGS. 1A and 1B, FIGS. 2A and 2B, and FIGS. 3A and 3B.

Figure 1A:
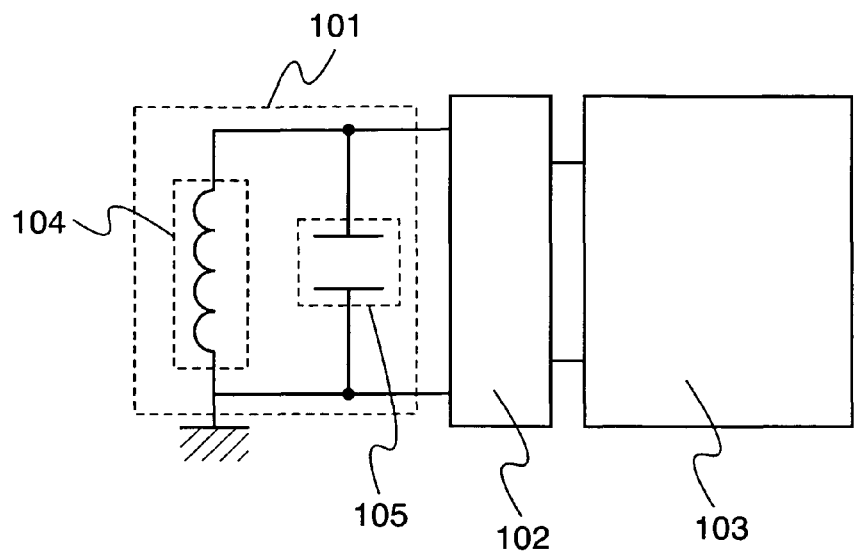
FIGS. 1A and 1B are diagrams for describing a mode of a semiconductor device of the present invention.

As shown in FIG. 1A, a semiconductor device of the present invention includes a resonance circuit 101, a modulation/demodulation circuit 102 for modulating an electromagnetic wave, and an arithmetic circuit 103 for processing a signal. The resonance circuit 101 includes an antenna 104 and a capacitor 105.

Figure 1B:
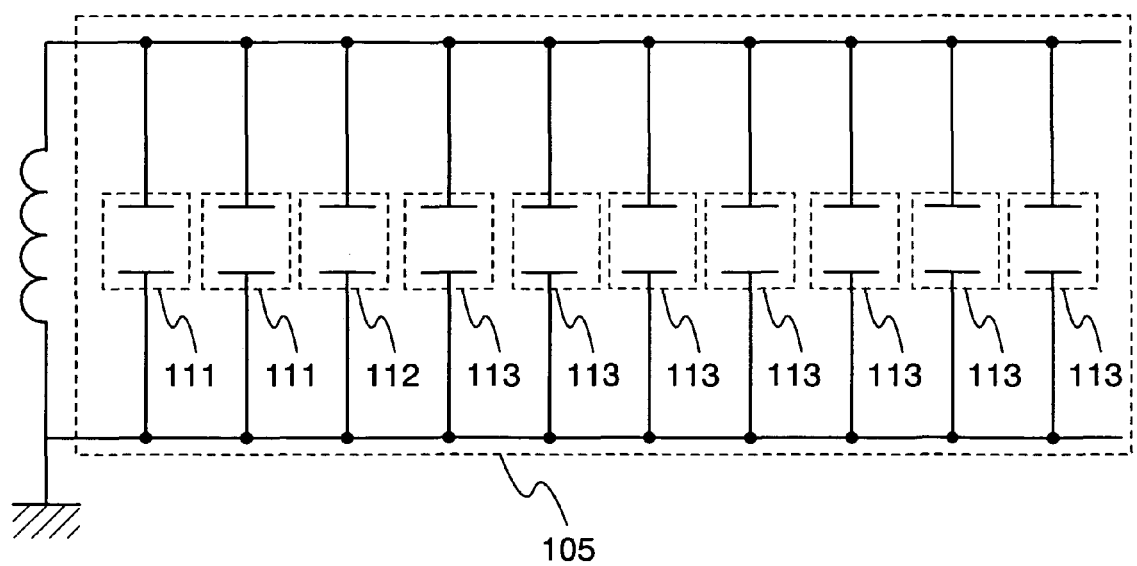
Figure 2A:
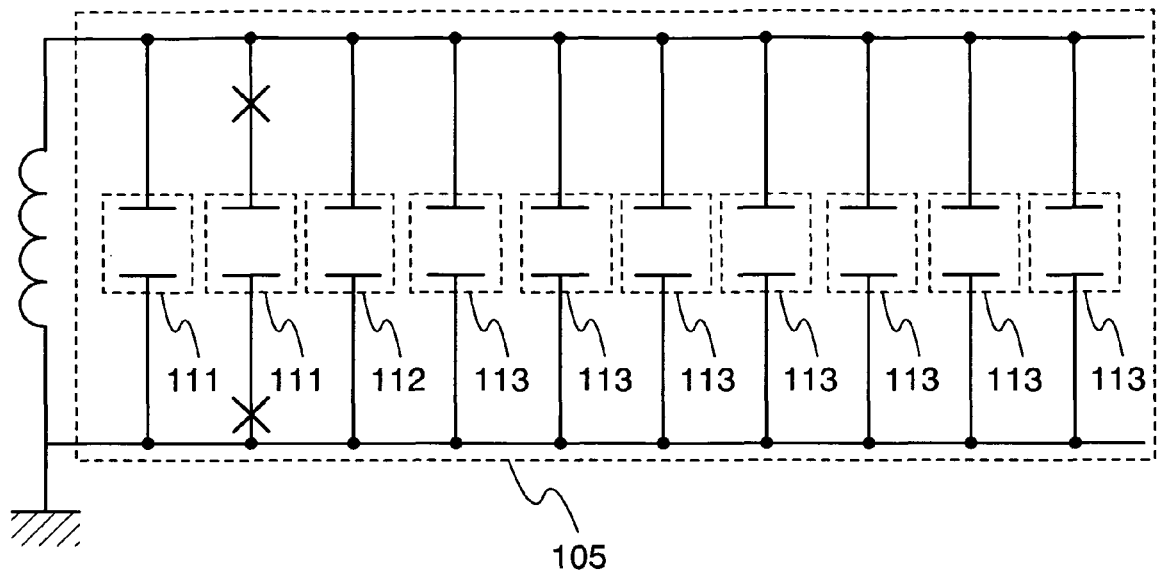
FIGS. 2A and 2B are diagrams for describing a mode of a semiconductor device of the present invention.
Figure 2B:
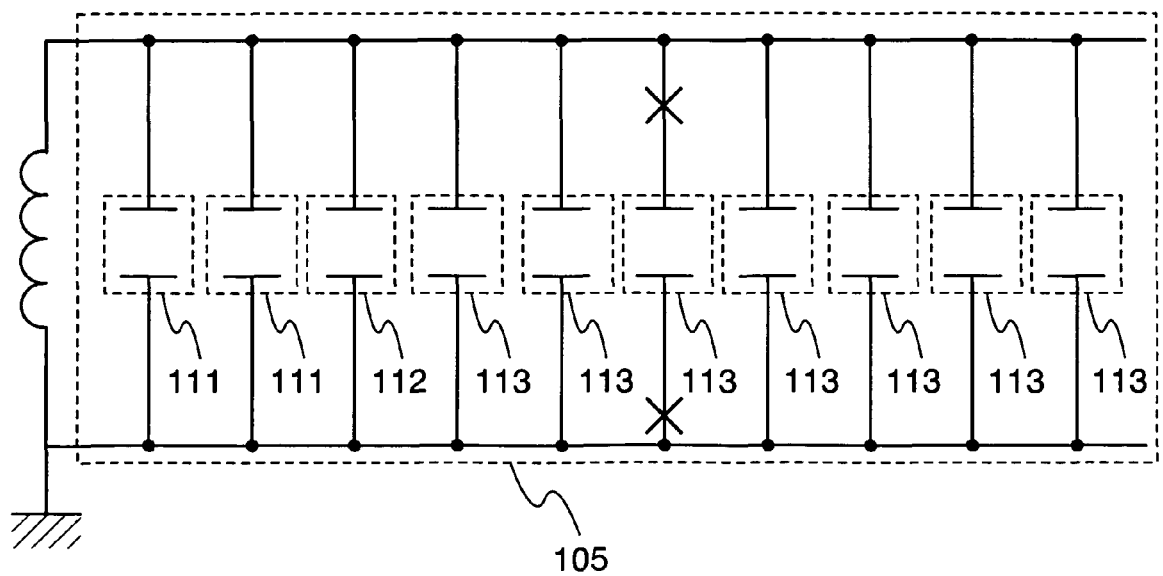

A configuration of the capacitor 105 is described with the use of FIG. 1B. In the semiconductor device of the present embodiment mode, the capacitor 105 is formed of two pieces of first capacitor 111, a piece of second capacitor 112, and seven pieces of third capacitor 113, and these capacitors are connected in parallel. The first capacitor 111, the second capacitor 112, and the third capacitors 113 have different capacitance values from each other. When a capacitance value of the first capacitor 111 is $C_1$, a capacitance value of the second capacitor is $C_2$, and a capacitance value of the third capacitor is $C_3(C_1 > C_2 > C_3)$, a capacitance value $C_5$ of the capacitor 105 is the sum of all of these capacitance values ($=2 \times C_1 + 1 \times C_2 + 7 \times C_3$).

In such a manner, by dividing the capacitor 105 into a plurality of capacitors each of which has a different magnitude, the capacitance value of the capacitor 105 can be easily to be adjusted, and resonance frequency can be easily adapted to the desired frequency. For example, when the resonance frequency is largely different from the desired frequency, the frequency can be adjusted by disconnecting both ends (portions represented by a cross mark in FIG. 2A) of the first capacitor 111 that has the largest capacitance value to be separated from the capacitor 105, and changing the capacitance value of the capacitor 105. Further, when the resonance frequency has a few difference from the desired frequency and fine adjustment is conducted, the frequency can be adjusted by disconnecting both ends (portions represented by a cross mark in FIG. 2B) of the third capacitor 113 that has the smallest capacitance value to be separated from the capacitor 105, and changing the capacitance value of the capacitor 105. It is to be noted that a method for separating a capacitor is not limited, however, a method for removing a wiring by laser irradiation or etching may be used.

The number of pieces of capacitor separated from the capacitor 105 is particularly not limited, and one piece or two or more pieces may be separated. For example, a piece of the first capacitor 111 and two pieces of the third capacitor 113 may be separated from the capacitor 105 as represented by $C_5 = 1 \times C_1 + 1 \times C_2 + 5 \times C_3$. For example, a piece of the second capacitor 112 and seven pieces of the third capacitor 113 may also be separated from the capacitor 105 as represented by $C_5 = 2 \times C_1$.

As described above, the semiconductor device of the present invention has a high degree of freedom for adjusting magnitude of the capacitor 105 and can adjust the frequency more precisely. Further, by using a semiconductor device in which frequency is adjusted in such a manner, communication of data with a reader/writer can be conducted more precisely.

Figure 3A:
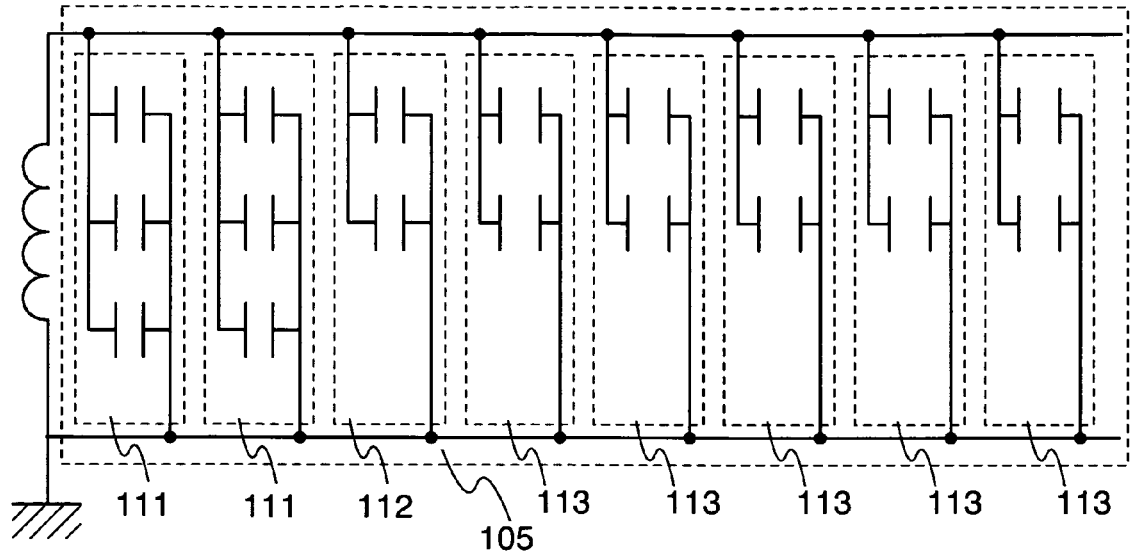
FIGS. 3A and 3B are diagrams for describing a mode of a semiconductor device of the present invention.
Figure 3B:
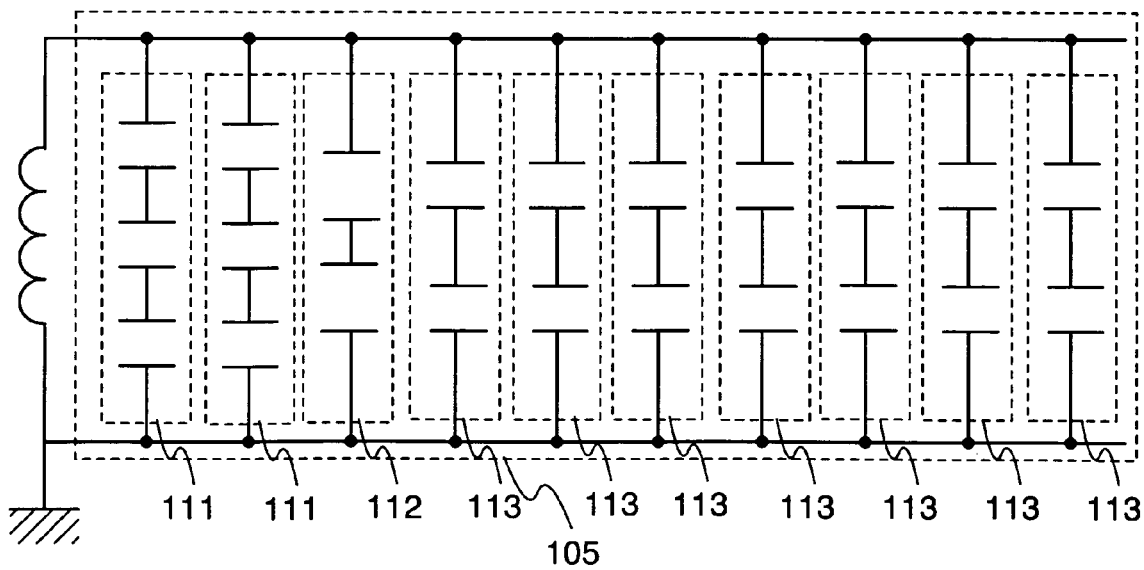

It is to be noted that resonance frequency, magnitude of a capacitor, the number of divided capacitor, and the like are not particularly limited, and they are arbitrarily determinated by those carrying out the invention. Further, it is preferable that each of the first capacitor 111, the second capacitor 112, and the third capacitor 113 have a configuration in which a plurality of capacitors is connected in parallel as shown in FIG. 3A. Furthermore, a configuration in which a plurality of capacitors is connected in series as shown in FIG. 3B may be employed. In addition, a configuration of the modulation/demodulation circuit 102 and the arithmetic circuit 103 is not particularly limited. For example, in the arithmetic circuit 103, a memory, a memory controller, a signal processing circuit, a encoding circuit, resistance, a capacitor, a rectifying circuit, a filter, an analyzing circuit, a clock correction circuit, a counter circuit, a code extraction circuit, a code recognition circuit, a code determination circuit, and the like may also be provided.

Figure 4:
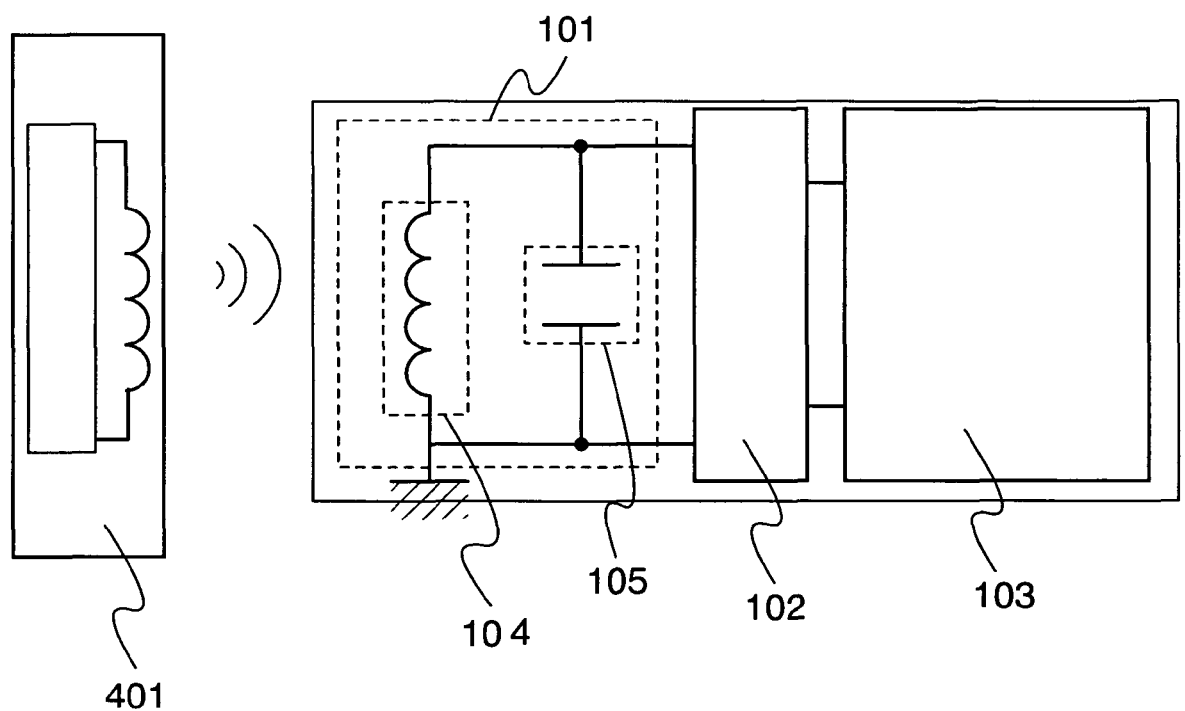
FIG. 4 is a diagram for describing a semiconductor device of the present invention.

As shown in FIG. 4, the semiconductor device of the present invention described above is used in a combination with a reader/writer 401. Specifically, when the semiconductor device of the present invention approaches the reader/writer 401, a carrier wave is transmitted from the reader/writer 401. Then, the carrier wave transmitted to the semiconductor device of the present invention is converted into an electric signal of an alternating current by the resonance circuit 101. Further, after demodulation by the modulation/demodulation circuit 102, the electric signal is processed in the arithmetic circuit 103. In addition, a case where a signal is transmitted from the arithmetic circuit 103 into the reader/writer 401 is as follows. First, a signal transmitted from the arithmetic circuit 103 into the modulation/demodulation circuit 102 is demodulated by the modulation/demodulation circuit 102, and a magnetic field is generated in the resonance circuit 101. By generation of this magnetic field, the reader/Writer 401 can receive a signal that is processed in the semiconductor device of the present invention. As described above, information that is recorded in the semiconductor device of the present invention can be read out and information can be recorded in the semiconductor device of the present invention.

Embodiment Mode 2

In the present embodiment mode, one mode of a method for manufacturing a semiconductor device of the present invention will be described with the use of FIGS. 5A to 5C, FIGS. 6A and 6B, FIGS. 7A and 7B, and FIG. 8.

Here, a cross sectional structure of a transistor provided in a modulation circuit and a cross sectional structure of a capacitor provided in a resonance circuit are specifically described. Accordingly, cross sectional views of a modulation circuit portion 761 and a resonance circuit portion 762 are shown in FIGS. 5A to 5C, FIGS. 6A and 6B, FIGS. 7A and 7B, and FIG. 8.

A peeling layer 702 is formed on one surface of a substrate 701 (see FIG. 5A). The substrate 701 has an insulating surface. In a case where the substrate is made of glass, an area and a shape thereof is not particularly limited. Therefore, when a substrate having a rectangular shape of which one side is one meter or more, for example, is used as the substrate 701, productivity can be remarkably improved. Such an advantage is an excellent advantage as compared to a case of using a single crystalline silicon substrate having a circular shape. Further, in a case where the substrate 701 is made of plastic, heat-resistant plastic that can resist a processing temperature of a manufacturing step is necessary to be used. As described below, after providing a thin film transistor over the substrate 701 made of glass, the thin film transistor may be peeled to be provided over a substrate made of plastic, which is preferable.

It is to be noted that the peeling layer 702 is provided on an entire surface of the substrate 701 in the present step; however, after providing a peeling layer on the entire surface of the substrate 701, the peeling layer may be processed into the predetermined shape by a photolithography method and an etching method to be selectively provided as needed. Further, the peeling layer 702 is formed so as to be in contact with the substrate 701; however an insulating layer as a base film is formed so as to be in contact with the substrate 701, and the peeling layer 702 may be formed as needed so as to be in contact with the insulating layer.

In order to obtain the peeling layer 702, a single layer or stacked layers are formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), silicon (Si), or the like; or an alloy material or a compound material that contains mainly the elements by sputtering, a plasma CVD method, or the like. The layer containing silicon may have any of an amorphous structure, a microcrystalline structure, and a polycrystalline structure.

Subsequently, an insulating layer 703 as a base film is formed to cover the peeling layer 702. In order to obtain the insulating layer 703, a single layer or stacked layers are formed to contain oxide of silicon or nitride of silicon by sputtering, a plasma CVD method, or the like. An oxide material of silicon is a substance containing silicon (Si) and oxygen (O), corresponds to silicon oxide, silicon oxide containing nitrogen, or the like. A nitride material of silicon is a substance containing silicon and nitrogen (N), and corresponds to silicon nitride, silicon nitride containing oxygen, or the like. The insulating layer that becomes a base film severs as a blocking film that prevents the invasion of impurities from the substrate 701.

Subsequently, an amorphous semiconductor layer 704 is formed over the insulating layer 703. The amorphous semiconductor layer 704 is formed by using sputtering, an LPCVD method, a plasma CVD method, or the like. Next, the amorphous semiconductor layer 704 is crystallized by laser crystallization, thermal crystallization using RTA or an annealing furnace, thermal crystallization using a metal element that promotes crystallization, laser crystallization combined with thermal crystallization using a metal element that promotes crystallization, or the like, thereby forming a crystalline semiconductor layer. Then, the obtained crystalline semiconductor layer is processed into the desired shape to form crystalline semiconductor layers 705 to 707 (see FIG. 5B). It is to be noted that impurities (whether N-type impurities or P-type impurities may be arbitrarily selected by a practitioner of the invention) is preferably added into the crystalline semiconductor layers 706 and 707 to adjust a threshold value of transistors. Further, N-type impurities (for example, phosphorus or arsenic) are preferably added into a semiconductor layer that is provided for forming a capacitor as the crystalline semiconductor layer 705.

An example of manufacturing steps of the crystalline semiconductor layers 705 to 707 is described below. After a solution containing nickel that is a metal element for promoting crystallization is retained on a surface of the amorphous semiconductor layer 704, the amorphous semiconductor layer 704 is subjected to dehydrogenation treatment (500° C., one hour) and thermal crystallization (550° C., four hours); thereby forming a crystalline semiconductor layer. Then, the crystalline semiconductor layer is irradiated with laser light as needed, and patterned by photolithography and etching to form the crystalline semiconductor layers 705 to 707. When the crystalline semiconductor layers are formed by laser crystallization, a gas laser or a solid-state laser is used. The gas laser and the solid-state laser may be either a continuous wave laser or a pulsed laser.

When the amorphous semiconductor layer is crystallized by using a metal element that promotes crystallization, crystallization can be performed at a low temperature in a short time and crystals can be aligned in the same direction. On the other hand, an off-current increases because the metal element remains in the crystalline semiconductor layers, leading to variations in characteristics. Accordingly, an amorphous semiconductor layer serving as a gettering site is preferably formed over the crystalline semiconductor layers. The amorphous semiconductor layer serving as a gettering site is required to contain an impurity element such as phosphorus and argon; therefore, it is preferably formed by sputtering so as to contain argon at a high concentration. Then, a metal element is diffused in the amorphous semiconductor layer by heat treatment (such as thermal annealing using RTA or an annealing furnace), and the amorphous semiconductor layer containing the metal element is removed. As a result, content of the metal element in the crystalline semiconductor layers can be reduced or removed.

Subsequently, a gate insulating layer 708 is formed to cover the crystalline semiconductor layers 705 to 707. In order to obtain the gate insulating layer 708, a single layer or stacked layers are formed of a layer containing an oxide of silicon or a nitride of silicon by a plasma CVD method or sputtering. In a case of forming the gate insulating layer 708, it is preferable to perform treatment in which surfaces of the crystalline semiconductor layers 705 to 707 are oxidized by using a high electronic density plasma. Accordingly, minute oxide films can be formed on the surfaces of the crystalline semiconductor layers 705 to 707, and transistor characteristics are improved.

A first conductive layer and a second conductive layer are stacked over the gate insulating layer 708. The first conductive layer is formed by a plasma CVD method or sputtering to have a thickness of 20 to 100 nm. The second conductive layer is formed by a plasma CVD method or sputtering to have a thickness of 100 to 400 nm. The first conductive layer and the second conductive layer are formed of an element selected from tantalum (Ta), tungsten (W), titanium (Ti), molybdenum (Mo), aluminum (Al), copper (Cu), chromium (Cr), or the like; or an alloy material or a compound material that mainly contains these elements. Alternatively, the first conductive layer and the second conductive layer are formed of a semiconductor material typified by polycrystalline silicon doped with an impurity element such as phosphorus. The first conductive layer and the second conductive layer may be formed of, for example, a tantalum nitride layer and a tungsten layer; a tungsten nitride layer and a tungsten layer; a molybdenum nitride layer and a molybdenum layer; or the like. If the first conductive layer and the second conductive layer are formed of tungsten or tantalum nitride that has high heat-resistance, they may be subjected to heat treatment for thermal activation. If a three-layer structure is adopted instead of the two-layer structure, a molybdenum layer, an aluminum layer and a molybdenum layer may be stacked.

A resist mask is formed by photolithography. Then, etching treatment for forming a gate electrode and a wiring is performed to form a conductive layer serving as a capacitor electrode formed by stacking a conductive layer 710 over a conductive layer 709, a conductive layer serving as a gate electrode formed by stacking a conductive layer 712 over a conductive layer 711, a conductive layer serving as a gate electrode formed by stacking a conductive layer 714 over a conductive layer 713, and a conductive layer serving as a wiring formed by stacking a conductive layer 716 over a conductive layer 715.

Subsequently, an impurity element that imparts N-type conductivity is added into the crystalline semiconductor layers 705 and 706 at a low concentration by ion doping or ion implantation, thereby forming impurity regions 717 and 718. The impurity element that imparts N-type conductivity may be an element belonging to group 15 of the periodic table, and for example, phosphorus (P) or arsenic (As) may be used. The impurities are not added into portions where the conductive layers are stacked in the crystalline semiconductor layers 705 and 706, and the portions become channel forming regions.

A resist mask is formed by photolithography, and an impurity element that imparts P-type conductivity is added into the crystalline semiconductor layer 707 at a high concentration, thereby forming an impurity region 719. As the impurity element that imparts P-type conductivity, for example, boron (B) is used. The impurities are not added into a portion where the conductive layers are stacked in the crystalline semiconductor layer 707, and the portion becomes a channel forming region.

An insulating layer is formed to cover the gate insulating layer 708 and the conductive layers 709 to 716. In order to obtain the insulating layer, a single layer or stacked layers are formed by a plasma CVD method, an LPCVD method or sputtering using a layer containing an inorganic material such as silicon, an oxide of silicon, and a nitride of silicon, or a layer containing an organic material such as an organic resin. Then, the insulating layer is selectively etched by anisotropic etching that is mainly in the perpendicular direction to the surface of the substrate, so that sidewalls 720 to 723 are formed in contact with the sides of the conductive layers 709 to 716 (see FIG. 5C). While forming the side walls 720 to 723, insulating layers 724 to 727 are formed by etching the insulating layer 708. The insulating layers 724 to 727 are used as masks in a subsequent doping step for forming LDD (Lightly Doped Drain) regions.

A resist mask is formed by photolithography. Then, an impurity element that imparts N-type conductivity is added into the crystalline semiconductor layers 705 and 706 at a high concentration with the use of the resist mask and the side walls 720 to 723 as a mask; thereby forming first impurity regions 728 and 729. The N-type impurities with a high concentration are not added into regions that are masked with the side walls 720 to 723 in the impurity regions 717 and 718, and the regions become second impurity regions 730 and 731 (also called LDD regions). The concentration of the impurity element in the first impurity regions 728 and 729 is higher than that in the second impurity regions 730 and 731. Through the above steps, an N-channel transistor 732, a P-channel transistor 733, a capacitor 734, and a wiring 735 are completed. It is to be noted that the conductive layers 709 and 710 of the capacitor 734 are respectively connected to the conductive layers 715 and 716 of the wiring 735 (however, they are connected to portions that are different from portions shown in a sectional view of FIG. 5C.).

Subsequently, an insulating layer is formed by a single layer or stacked layers to cover the transistors 732 and 733, the capacitor 734, and the wiring 735 (see FIG. 6A). In order to obtain the insulating layer covering the transistors 732 and 733, the capacitor 734, and the wiring 735, a single layer or stacked layers are formed by a coating method, a droplet discharging method, or the like using an inorganic material such as an oxide of silicon and a nitride of silicon, an organic material such as polyimide, polyamide, benzocyclobutene, acrylic, epoxy, and siloxane, or the like. Siloxane corresponds to a resin including Si—O—Si bond. Siloxane includes a skeleton structure from the bond of silicon (Si) and oxygen (O). As a substituent, an alkyl group or a fluoro group is used.

If the insulating layer covering the transistors 732 and 733, the capacitor 734, and the wiring 735 has, for example, a three-layer structure, a layer containing silicon oxide may be formed as a first insulating layer 736, a layer containing a resin may be formed as a second insulating layer 737, and a layer containing silicon nitride may be formed as a third insulating layer 738.

Before forming the insulating layers 736 to 738 or after forming one or a plurality of the insulating layers 736 to 738, heat treatment may be performed for recovery of the crystallinity of the semiconductor layers, activation of the impurity elements added into the semiconductor layers, and hydrogenation of the semiconductor layers. As the heat treatment, thermal annealing, laser annealing, RTA or the like may be applied.

Next, a resist mask is formed by photolithography, and the insulating layers 736 to 738 are etched with the use of the mask; thereby forming openings to expose the first impurity regions 728 and 729, the impurity region 719 and the conductive layer 716. Then, conductive layers are formed to fill in the openings, and patterned to form conductive layers 739 to 745 serving as a wiring for transmitting a signal to the transistor 732 and 733 and the capacitor 734.

In order to obtain the conductive layers 739 to 745, a single layer or stacked layers are formed by a plasma CVD method or sputtering using an element selected from titanium (Ti), aluminum (Al), neodymium (Nd), or the like; or an alloy material or a compound material that mainly contains these elements. The alloy material mainly containing aluminum corresponds to, for example, a material that mainly contains aluminum and contains nickel, a material that mainly contains aluminum and contains silicon, or a material that mainly contains aluminum and contains one or a plurality of elements of nickel, carbon, and silicon. The conductive layers 739 to 745 may adopt, for example, a stacked layer structure of a barrier layer, an aluminum layer containing silicon, and a barrier layer; or a stacked layer structure of a barrier layer, an aluminum layer containing silicon, a titanium nitride layer, and a barrier layer. Here, an aluminum layer containing silicon contains silicon of 0.1 wt % to 5 wt %. In addition, the barrier layer corresponds to a thin film made of titanium, a nitride of titanium, molybdenum, or a nitride of molybdenum. Aluminum and aluminum containing silicon are optimal for the material of the conductive layers 739 to 745 because they have a low resistance value and are inexpensive. If barrier layers are provided as the top and bottom layers, hillock generation of aluminum or aluminum containing silicon can be prevented. Further, when the barrier layer is made of titanium that has high reducing ability, even if a thin natural oxide film is formed over the crystalline semiconductor layers, the natural thin oxide film is reduced, and accordingly, disconnection between the barrier layer and the crystalline semiconductor layers can be suppressed.

Next, an insulating layer 746 is formed so as to cover the conductive layers 739 to 745 (see FIG. 6B). In order to obtain the insulating layer 746, a single layer or stacked layers are formed by a coating method, a droplet discharging method, or the like using an inorganic material or an organic material. It is preferable to form the insulating layer 746 to have a thickness of 0.75 µm to 3 µm.

Subsequently, a resist mask is formed by photolithography, and the insulating layer 746 is etched with the use of the mask; thereby forming openings to expose the conductive layers 739, 741, and 745. Then, conductive layers are formed to fill in the openings. The conductive layers are formed by a plasma CVD method or sputtering using a conductive material. Thereafter, the conductive layers are patterned to form conductive layers 747 to 749.

An insulating layer 750 is formed to cover the conductive layers 747 to 749. In order to obtain the insulating layer 750, a single layer or a stacked layers are formed by a coating method, a droplet discharging method, or the like using an inorganic material or an organic material. It is preferable to form the insulating layer 750 to have a thickness of 0.75 to 3

μm. Then, the insulating layer 750 is etched; thereby forming openings to expose the conductive layers 747 to 749.

Next, a conductive layer 751 serving as an antenna is formed being in contact with the conductive layers 747 to 749 (see FIG. 7A). The conductive layer 751 is formed by a plasma CVD method, sputtering, a printing method, or a droplet discharging method using a conductive material. In order to obtain the conductive layer 751, preferably, a single layer or stacked layers are formed using an element selected from aluminum (Al), titanium (Ti), silver (Ag), copper (Cu), or the like; or an alloy material or a compound material that mainly contains these elements. Specifically, the conductive layer 751 is formed by a screen printing method using a paste containing silver, and then, subjected to heat treatment at a temperature of 50 to 350° C. Alternatively, the conductive layer 751 is obtained by forming an aluminum layer by sputtering and then patterning the aluminum layer. The aluminum layer is preferably patterned by wet etching, and then, subjected to heat treatment at a temperature of 200 to 300° C.

An insulating layer 752 serving as a protective layer is formed by a coating method, a droplet discharging method, or the like so as to cover the conductive layer 751 serving as an antenna. The insulating layer 752 is formed using a layer containing carbon such as DLC (Diamond Like Carbon), a layer containing silicon nitride, a layer containing silicon nitride oxide, or an organic material (preferably, an epoxy resin).

Next, a resist mask is formed by photolithography, and the insulating layers 703, 736, 737, 738, 746, 750, and 752 are etched with the use of the mask so as to expose the peeling layer 702; thereby forming an opening 753 (see FIG. 7A).

An etchant is put into the opening 753 to remove the peeling layer 702 (see FIG. 7B). As the etchant, a gas or a liquid containing halogen fluoride is used. For example, chlorine trifluoride ($ClF_3$), nitrogen trifluoride ($NF_3$), bromine trifluoride ($BrF_3$), or hydrogen fluoride (HF) is used as the etchant. It is to be noted that if hydrogen fluoride is used as the etchant, the peeling layer 702 is formed of silicon oxide. Through the above steps, an element group of the transistors 732 and 733, the capacitor 734, and the like, and an integrated circuit 754 including the conductive layer 751 serving as an antenna are separated from the substrate 701.

The substrate 701 separated from the integrated circuit 754 is preferably reused for cost reduction. The insulating layer 752 is formed to prevent the integrated circuit 754 from scattering after the peeling layer 702 is removed. Since the integrated circuit 754 is small, thin and lightweight, it easily scatters as it is not tightly attached to the substrate 701 after the peeling layer 702 is removed. However, by forming the insulating layer 752 over the integrated circuit 754, the weight of the integrated circuit 754 increases, and thus, the scattering of the integrated circuit 754 from the substrate 701 can be prevented. The integrated circuit 754 itself is thin and lightweight; however, by forming the insulating layer 752, the integrated circuit 754 is not bent by stress and can have a certain degree of strength.

Figure 8:
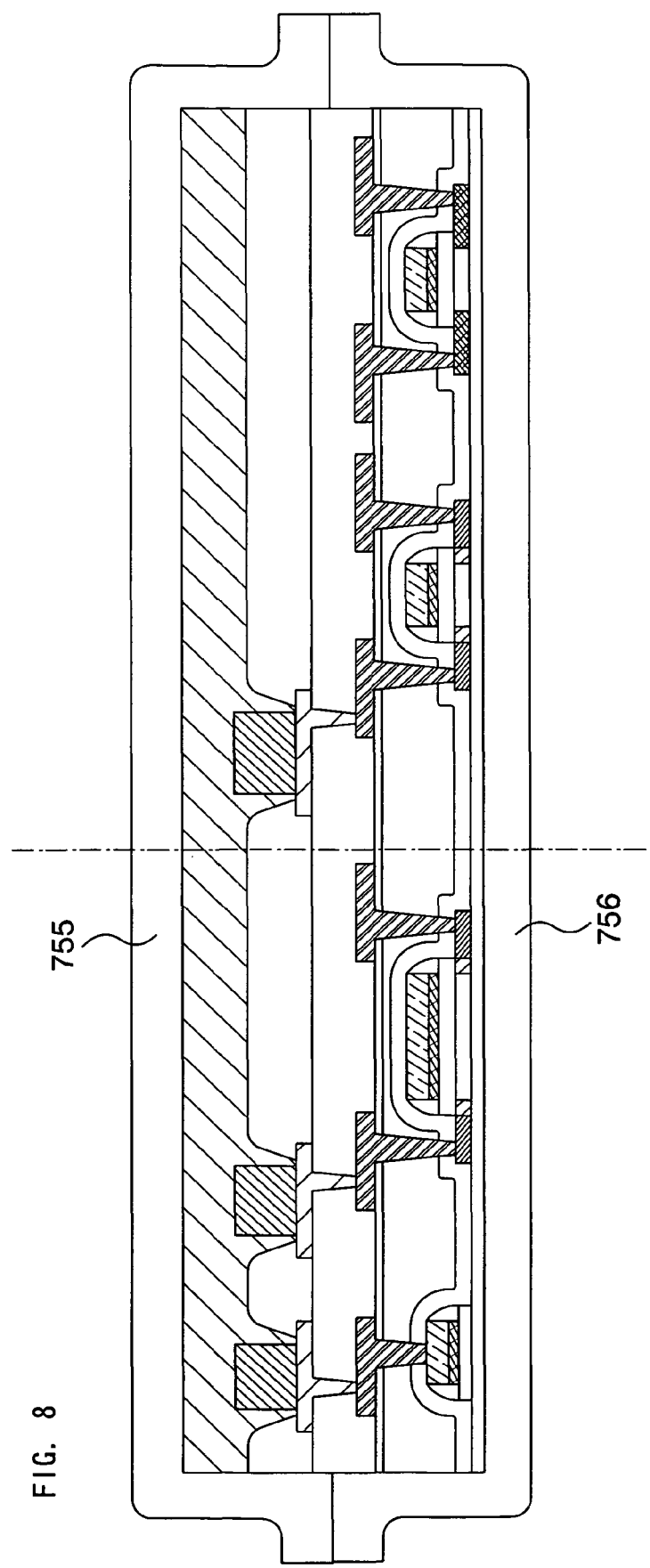
FIG. 8 is a view for describing a mode of a method for a manufacturing a semiconductor device of the present invention.

Next, one surface of the integrated circuit 754 is attached to a first substratum 755 and completely separated from the substrate 701 (see FIG. 8). Then, another surface of the integrated circuit 754 is attached to a second substratum 756, and the integrated circuit 754 is sealed with the first substratum 755 and the second substratum 756 by applying one or both of heat treatment and pressure treatment. Each of the first substratum 755 and the second substratum 756 corresponds to a film made of polypropylene, polyester, vinyl, polyvinyl fluoride, vinyl chloride, or the like; paper of a fibrous material; a stacked film of a base film (polyester, polyamide, an inorganic vapor deposited film, paper, or the like) and an adhesive synthetic resin film (an acrylic-based synthetic resin, an epoxy-based synthetic resin, or the like); and the like. An adhesive layer that is provided on the uppermost surface of the film, or a layer (not an adhesive layer) that is provided on the outermost surface of the film are melted by heat treatment, and attached by pressure treatment. Further, adhesive layers may be provided on the surfaces of the first substratum 755 and the second substratum 756 or the adhesive layers may not necessarily provided. Each adhesive layers corresponds to a layer containing an adhesive such as a heat curing resin, an ultraviolet curing resin, a vinyl acetate resin-based adhesive, a vinyl copolymer resin-based adhesive, an epoxy resin-based adhesive, an urethane resin-based adhesive, a rubber-based adhesive, and an acrylic resin-based adhesive.

In a case where the first substratum 755 and the second substratum 756 are formed of plastic, it can be easily processed into a good design and flexible shape because plastic is thin and lightweight and capable of being bent. In addition, a plastic substratum has high impact resistance and can be easily attached to and incorporated in various products, leading to applications in various fields.

As described above, the capacitor 734 provided in a resonance circuit is formed to have a structure in which the insulating layer 724 is interposed between an electrode constituted by the conductive layers 709 and 710 that are formed simultaneously with the conductive layer serving as a gate electrode; and the semiconductor layer 705 that is formed simultaneously with a semiconductor layer including a channel formed in a transistor. Therefore, a semiconductor device can be formed without providing further more steps for forming the capacitor. Accordingly, the steps are simplified to reduce the manufacturing cost.

Figure 9:
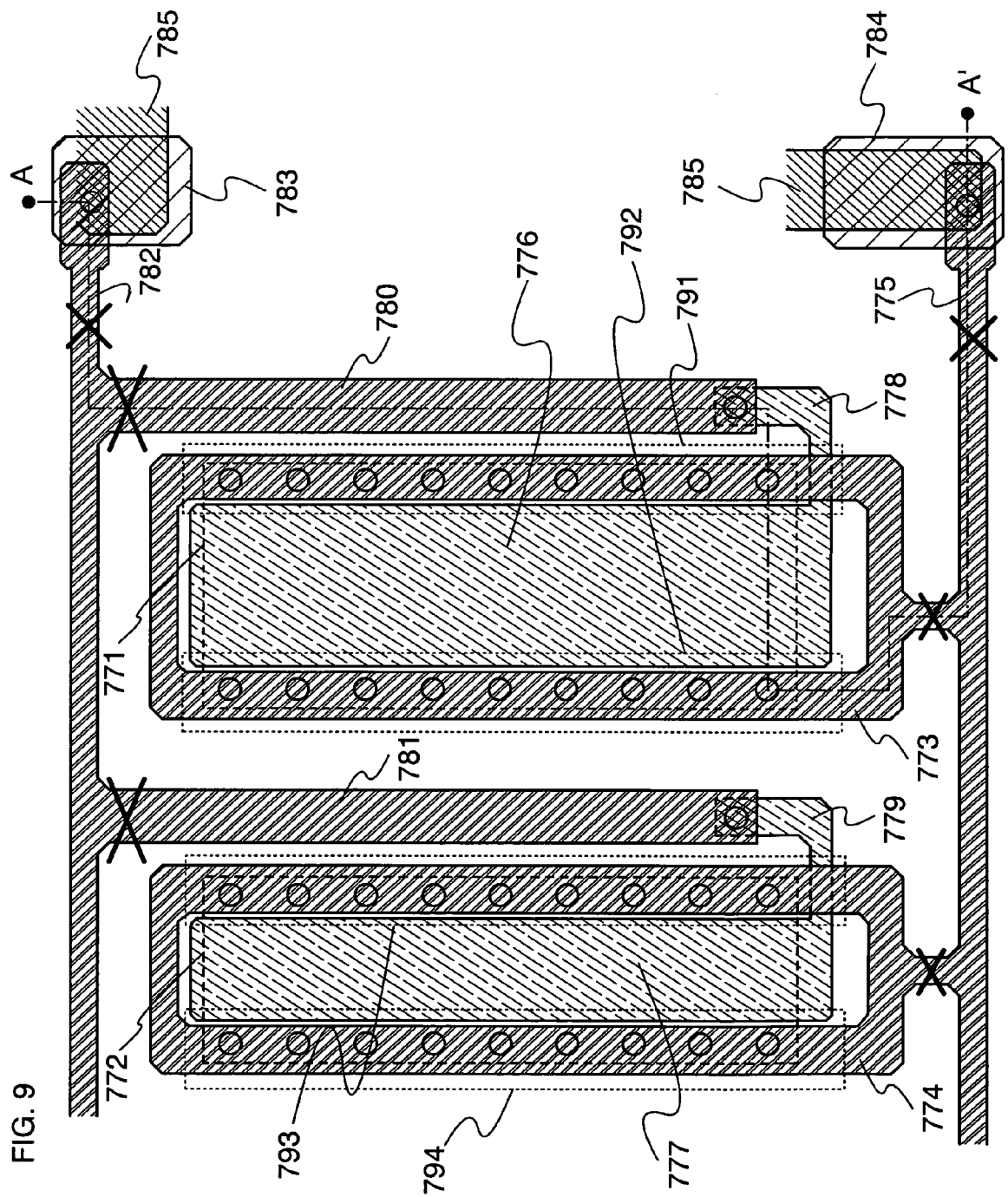
FIG. 9 is a top view for describing a structure of a capacitor provided in a semiconductor device of the present invention.

As described above, a semiconductor device of the present invention can be manufactured. It is to be noted that a connection of the wiring provided in the resonance circuit portion 762 is shown in a top view of FIG. 9. In FIG. 9, first impurity regions 791, 792, 793, and 794 with a high concentration, which are provided in semiconductor layers 771 and 772, are electrically connected to each other with wirings 773 and 774. In addition, each wiring 773 and 774 is connected to a wiring 775. Electrodes 776 and 777 formed with conductive layers serving as a gate electrode are electrically connected to wirings 780 and 781 that are formed in the same layer as the wirings 773, 774, and 775 through wirings 778 and 779, respectively. Further, the wirings 780 and 781 are connected to a wiring 782. The wiring 775 is connected to an antenna 785 through a wiring 784 that is formed of a conductive layer provided in a different layer from the wiring 775. The wiring 782 is electrically connected to an antenna 785 through the wiring 783 that is formed of a conductive layer provided in the different layer from the wiring 775. It is to be noted that the wirings 773, 774, 775, 780, 781, and 782 are formed simultaneously, and the electrodes 776 and 777, and the wirings 778 and 779 are formed simultaneously. Further, the wirings 783 and 784 are also formed simultaneously. A first capacitor including the semiconductor layer 771 and the electrode 776, and a second capacitor including the semiconductor layer 772 and the electrode 777 are connected in parallel. The first capacitor is larger than the second capacitor. In the resonance circuit portion, a plurality of capacitors is included as well as the first capacitor and the second capacitor. Each capacitor is connected in parallel or series. It is to be noted that a cross sectional view of the resonance circuit portion 762 in FIG. 7A corresponds to a portion indicated by a broken line A-A' in FIG. 9. Specifically, the wiring 773 corresponds to the conductive layers 739 and 740 in FIG. 7A, and the wiring 778 corresponds to the wiring 735 including the conductive layer 716. The wiring 780 corresponds to the wiring 745, the wiring 783 corresponds to the conductive layer 747, and the wiring 784 corresponds to the conductive layer 748.

In a case where magnitude of a capacitor is adjusted in the resonance circuit portion having the above structure, the capacitor can be separated from the resonance circuit by cutting off portions represented by a cross mark in FIG. 9. It is to be noted that each corner of the wirings are preferably formed to have a round shape. Accordingly, electric charges accumulating in the corners are reduced, and dust and the like attached to a semiconductor device can be reduced.

Embodiment Mode 3

A structure of a transistor and a capacitor provided in a semiconductor device of the present invention is not limited to the structure described in Embodiment Mode 2. In the present embodiment mode, a mode of a transistor capacitor having different structure from that described in Embodiment Mode 2 will be described with reference to FIGS. 13A and 13B.

It is to be noted that former steps of forming a gate insulating layer and subsequent steps of forming an insulating layer to cover a transistor and the like are the same as the steps in Embodiment Mode 2; therefore, the description in Embodiment Mode 2 is applied to the steps.

Figure 13A:
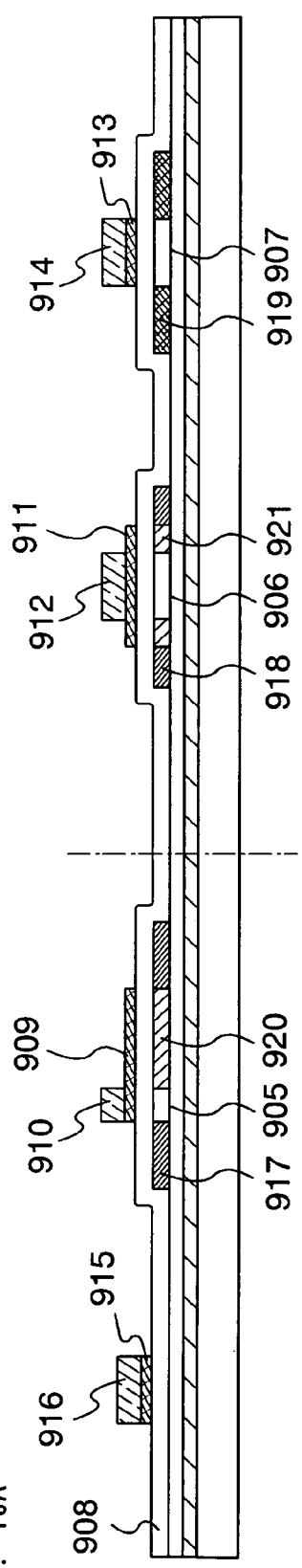
FIGS. 13A and 13B are views for describing a mode of a semiconductor device of the present invention.
Figure 13B:
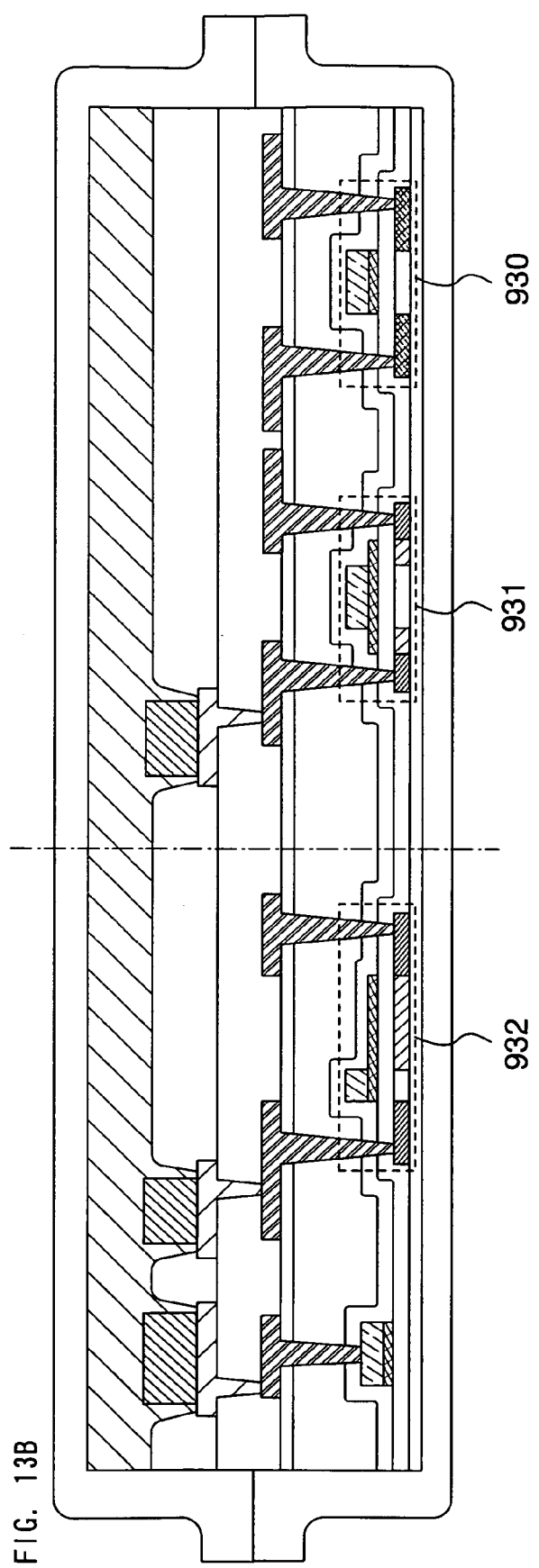

A first conductive layer and a second conductive layer are stacked over a gate insulating layer 908. It is to be noted that the first and second conductive layers are similar to the first and second conductive layers in Embodiment Mode 2. A mask formed of a resist is formed by photolithography over the second conductive layer that is provided in upper side of the first conductive layer, and then, the first and second conductive layers are etched. At this time, in the mask used for exposure (also called reticle), it is preferable to form a pattern in which a region provided without a light shielding layer, a region provided with a light shielding layer, and a region of which light transmissivity is lower than in the region provided without a light shielding layer and higher than in the region provided with a light shielding layer are provided. Accordingly, through performing photolithography, amount of light exposure with which the resist is irradiated can be changed depending on parts, and thicknesses of the resist that remains after development can be made to have a difference locally. By making the thicknesses of the resist have a difference locally, the first and second conductive layers can be etched so that, for example, second conductive layers 910, 912, 914, and 916 remain in the portion where the thick resist remains, and first conductive layers 909, 911, 912, and 915 remain in the portion where the thin resist remains as shown in FIG. 13A.

Subsequently, N-type impurities are added into crystalline semiconductor layers 905 and 906 using the conductive layers 909, 910, 911, and 912 as a mask (a portion for a P-channel transistor 930 is protected with the mask). Accordingly, first impurity regions 920 and 921 to which impurities with a low concentration are added; and second impurity regions 917 and 918 to which impurities with a high concentration are added can be respectively provided in the crystalline semiconductor layers 905 and 906.

Then, the portion for an N-channel transistor 931 and a portion for a capacitor 932 are protected using a resist mask, and P-type impurities are added into a crystalline semiconductor layer 907 to provide an impurity region 919 with a high concentration.

By forming the transistor and the capacitor as described above, an impurity region with a low concentration (the first impurity region 921) can be provided by self-alignment, which is preferable. Further, impurities addition into the crystalline semiconductor layer 905 in the capacitor can be performed simultaneously with the formation of the first impurity regions and the second impurity region, which is preferable. In addition, it is preferable to form a region where the first impurity region and the second impurity region are in contacted with each other in the capacitor 932. In the capacitor 932, the conductive layer 910 serves as a supporting wiring for moderating resistance of the conductive layer 909.

After forming the transistor and the capacitor that have a different structure form that in Embodiment Mode 2 as described above, as shown in FIG. 13B, insulating layers covering the transistor, wirings, antennas, and the like are provided as described in Embodiment Mode 2, and a semiconductor device of the present invention can be obtained.

Embodiment 1

A method for adjusting resonance frequency f that is to be 13.56 MHz with the use of a semiconductor device of the present invention will be described.

$$f = \frac{1}{2\pi\sqrt{LC}} \quad (1)$$

In the formula (1), f is resonance frequency, L is inductance of a coil, and C is resonance capacity.

When L is 4.592 mH and C is 30 pF in the above formula (1), in a semiconductor device having a structure in which f is approximately desired 13.56 MHz initial capacity is provided to be 50 pF.

Figure 10:
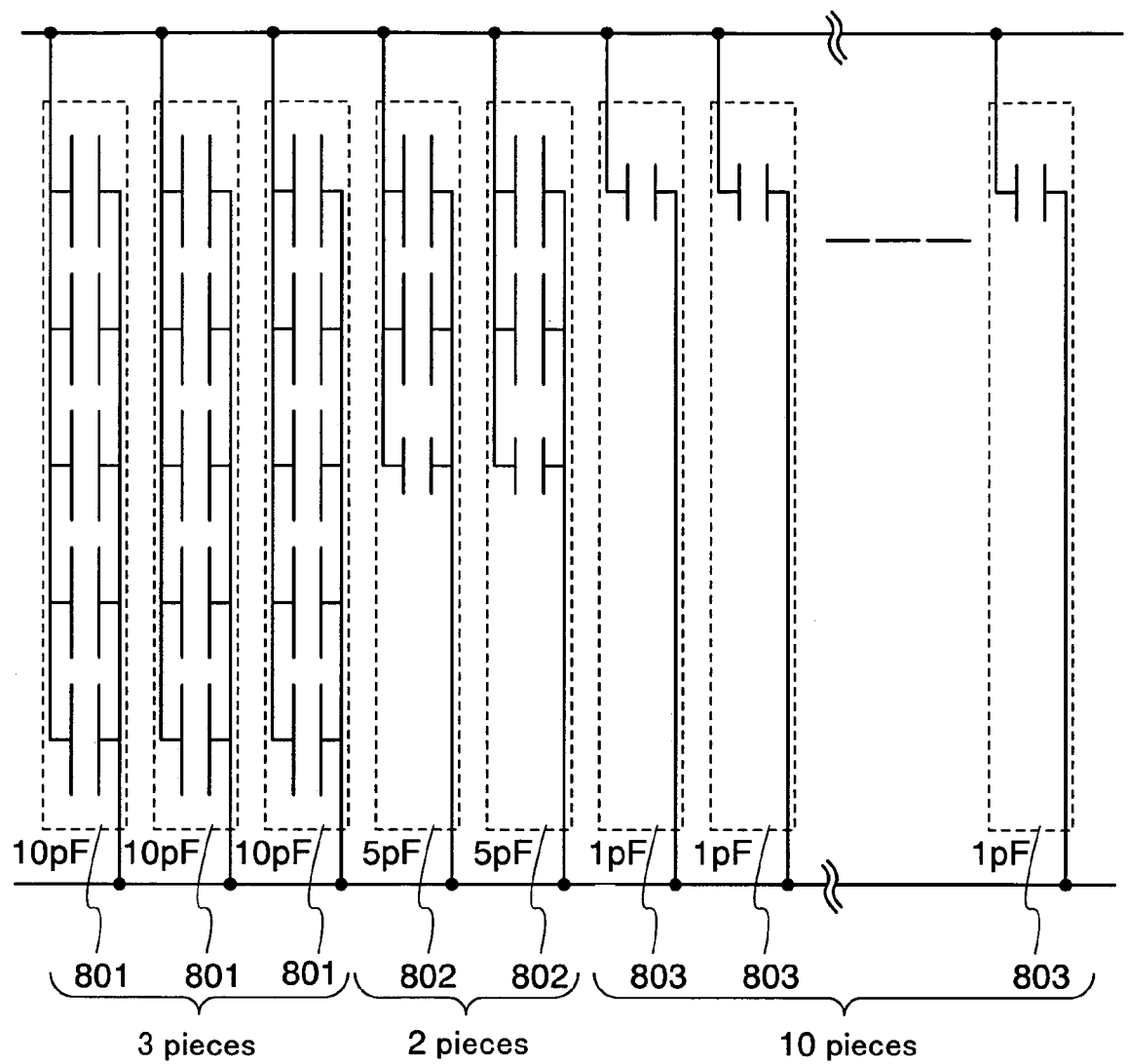
FIG. 10 is a diagram for describing a configuration of a semiconductor device in Embodiment 1.

Here, a configuration of such a C will be described, in a case where for example, L is 4.592 mH, and capacity C in the initial state includes 50 pF in total by three pieces of first capacitor 801 of 10 pF, two pieces of second capacitor 802 of 5 pF, and 10 pieces of third capacitor 803 of 1 pF, which are connected in parallel as shown in FIG. 10, and C is made to be 30 pF by approximately selecting the first, second, and third capacitor to be separated, and f is adjusted to be desired 13.56 MHz.

In FIG. 10, the first capacitor 801 is formed by connecting five pieces of capacitor of 2 pF in parallel. The second capacitor 802 is formed by connecting two pieces of capacitor of 2 pF and a piece of capacitor of 1 pF in parallel. The third capacitor 803 is formed by a piece of capacitor of 1 pF.

A table 1 shows the number of pieces and magnitude of the first capacitor 801, the second capacitor 802, and the third capacitor 803, and magnitude of resonance capacitor C that is obtained by combining these capacitors. It is to be noted that adjustment methods 1 to 5 show the number of remaining capacitors after separating excess capacitors.

TABLE 1

| | | first capacitor | second capacitor | third capacitor | magnitude of resonance C = first capacitor + second capacitor + third capacitor |
|---|---|---|---|---|---|
| initial state | | 10 pF × 3 | 5 pF × 2 | 1 pF × 10 | 50 |
| adjustment methods | 1 | 10 pF × 3 | | | 30 |
| | 2 | 10 pF × 2 | 5 pF × 2 | | 30 |

TABLE 1-continued

| | first capacitor | second capacitor | third capacitor | magnitude of resonance C = first capacitor + second capacitor + third capacitor |
|---|---|---|---|---|
| 3 | 10 pF × 2 | 5 pF × 1 | 1 pF × 5 | 30 |
| 4 | 10 pF × 2 | | 1 pF × 10 | 30 |
| 5 | 10 pF × 1 | 5 pF × 2 | 1 pF × 10 | 30 |

In accordance with the above table, there are five adjustment methods in total. In the adjustment method 1, magnitude of the resonance C is 30 pF including of three pieces of first capacitor 801 by separating two pieces of second capacitor 802 and ten pieces of third capacitor 803. In the case of the adjustment method 1, since capacity can be changed by every 1 pF, fine adjustment can be easily conducted. In the adjustment method 2, the first capacitor 801 is separated first, and the third capacitor 803 is gradually separated; therefore, fine adjustment becomes possible.

Embodiment 2

In the preset embodiment, the application of a semiconductor device 1001 of the present invention will be described with reference to FIGS. 11A and 11B and FIGS. 12A to 12E. The semiconductor device 1001 can be used by being provided in bills money, coins, securities, stock certificates, bearer bonds, certificates such as a driver's license, a certificate of residence, and a contract document (see FIG. 12A), packing containers such as a wrapping paper and a bottle (see FIG. 12B), recording media such as DVD software, CD, a video tape, MD, MO, and FD (see FIG. 12C), vehicles such as a car, a bike, and a bicycle (see FIG. 12D), personal belongings such as a bag and a pair of glasses (see FIG. 12E), foods, clothes, livingwares, electronic devices, and the like. The electronic devices indicate liquid crystal display devices, EL display devices, television devices (also called televisions or TV sets), cellular phones, and the like.

The semiconductor device 1001 can be fixed to products by being attached to surfaces of the products or embedded in the products. For example, the semiconductor device may be embedded in a paper of a book or in organic resin of a package made from the organic resin. A counterfeit can be prevented by providing the semiconductor device 1001 in the paper money, the coins, the securities, the bearer bonds, the certificates, and the like. The efficiency in an inspection system and a system for a rental shop can be promoted by providing the semiconductor device 1001 to the packing containers, the recording medium, the personal belongings, the foods, the garments, the livingwares, the electronic devices, and the like. The counterfeit and theft can be prevented by providing the semiconductor device 1001 to the vehicles and the like. The identification of individual creatures can be easily conducted by providing the semiconductor device to creatures such as animals. For example, the birth year, sex, kind, and the like of creatures can be easily identified by providing a wireless tag to the creatures such as livestock.

As described above, the semiconductor device 1001 of the present invention can be used by being provided in anything as long as it is a product (including creatures).

The semiconductor device 1001 has various advantages that data can be transmitted and received by wireless communication, processing into various shape is possible, directivity and an identification range are wide depending on selected frequency, and the like.

Figure 11A:
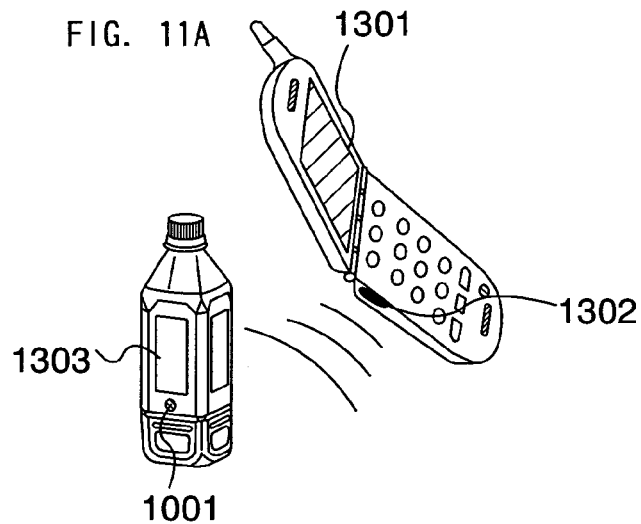
FIGS. 11A and 11B are views for describing application of a semiconductor device of the present invention.
Figure 11B:
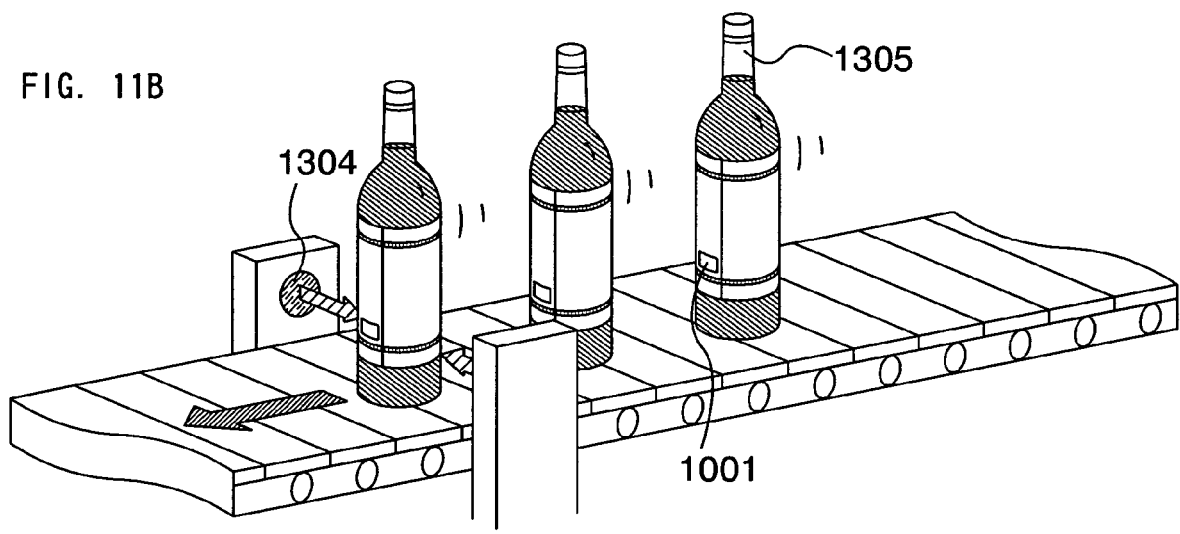
Figure 12A:
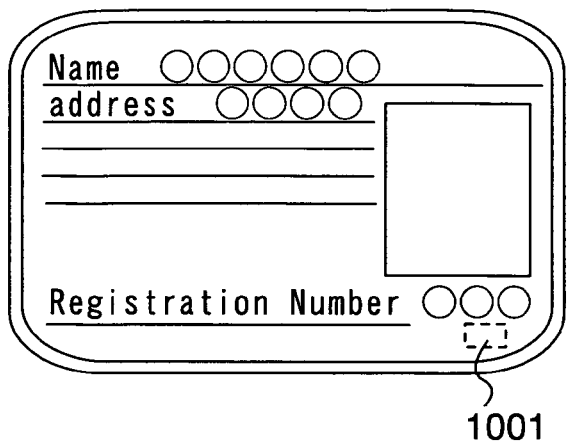
FIGS. 12A to 12E are views for describing application of a semiconductor device of the present invention.
Figure 12B:
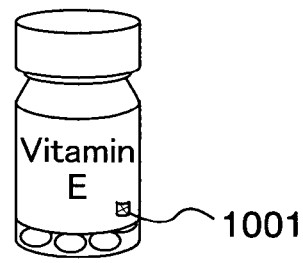
Figure 12C:
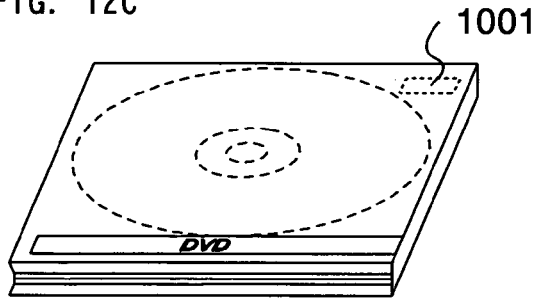
Figure 12D:
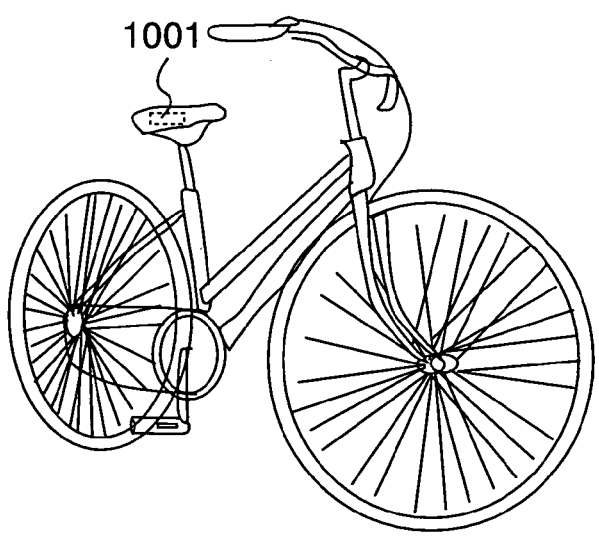
Figure 12E:
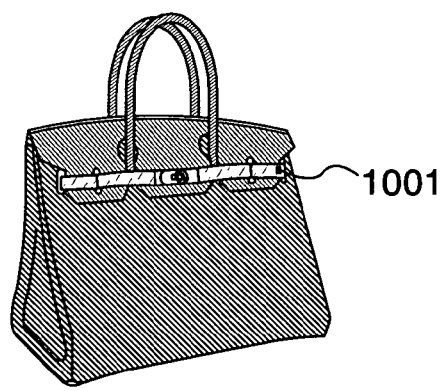

Subsequently, one mode of a system using the semiconductor device 1001 is described with reference to FIGS. 11A and 11B. A reader/writer 1302 is provided on a side of a portable terminal including a display portion 1301, and the semiconductor device 1001 is provided on a side of a product 1303 (see FIG. 11A). When the reader/writer 1302 is held against the semiconductor device 1001 included in the product 1303, information relating to the product, such as a raw material and a place of origin of the article, a test result in each production process, a history of distribution process, or further, description of the product 1303, is displayed in the display portion 1301. In addition, as another system, a product 1305 can be inspected by using a reader/writer 1304 and the semiconductor device 1001 in the case of transporting the product 1305 by a belt conveyor (see FIG. 11B). In such a manner, by utilizing the semiconductor device 1001 of the present invention for a system, information can be easily obtained, and a system in which a high function and a high added value are realized can be provided.

This application is based on Japanese Patent Application serial No. 2005-156108 filed in Japan Patent Office on May 27, 2005, the entire contents of which are hereby incorporated by reference.

What is claimed is:

1. A semiconductor device comprising a resonance circuit, said resonance circuit comprising:
   an antenna; and
   a capacitor connected to the antenna in parallel,
   wherein the capacitor comprises a plurality of capacitors connected in parallel,
   wherein at least one of the plurality of capacitors has a different capacitance value from at least another one of the plurality of capacitors; and
   wherein at least one capacitor selected from the plurality of capacitors is electrically separated from the capacitor of the resonance circuit so that a capacitance value of the capacitor in the resonance circuit is adjusted.

2. The semiconductor device according to claim 1, wherein each of the plurality of capacitors is a MIS capacitor.

3. A semiconductor device comprising a resonance circuit, said resonance circuit comprising:
   an antenna; and
   a capacitor connected to the antenna in parallel, wherein the capacitor comprises x pieces of first capacitor (x is an arbitrary natural number), y pieces of second capacitor (y is an arbitrary natural number), and z pieces of third capacitor (z is an arbitrary natural number) connected in parallel,
   wherein the first capacitor, the second capacitor, and the third capacitor have different capacitance values from each other, and
   wherein at least one capacitor selected from x pieces of the first capacitor, y pieces of the second capacitor, and z pieces of the third capacitor is electrically separated from the capacitor of the resonance circuit so that a capacitance value of the capacitor of the resonance circuit is adjusted.

4. The semiconductor device according to claim 3, wherein each of the first capacitor, the second capacitor, and the third capacitor is a MIS capacitor.

5. The semiconductor device according to claim 3, wherein at least one of the first capacitor, the second capacitor, and the third capacitor comprises a plurality of capacitors connected in series.

6. A semiconductor device comprising a resonance circuit, said resonance circuit comprising:

an antenna;
a capacitor;
a first wiring; and
a second wiring,
wherein the capacitor comprises a plurality of capacitors connected in parallel,
wherein at least one of the plurality of capacitors has different capacitance values from at least another one of the plurality of capacitors,
wherein each of the plurality of capacitors comprises an insulating layer interposed between a semiconductor layer and a conductive layer,
wherein the semiconductor layer is electrically connected to the antenna through the first wiring,
wherein the conductive layer is electrically connected to the antenna through the second wiring, and
wherein at least one capacitor selected from the plurality of capacitors is electrically separated from the capacitor of the resonance circuit so that a capacitance value of the capacitor of the resonance circuit is adjusted.

7. A semiconductor device comprising a resonance circuit, said resonance circuit comprising:
an antenna; and
a plurality of capacitors connected in parallel and directly to the antenna;
wherein the resonance circuit further includes at least one capacitor which is electrically separated from the plurality of capacitors, and
wherein at least one of said plurality of capacitors has a different capacitance value from at least another one of said plurality of capacitors.

8. The semiconductor device according to claim 7, wherein said plurality of capacitors is directly connected to the antenna.

9. The semiconductor device according to claim 7, wherein each of the plurality of capacitors is a MIS capacitor.

* * * * *

UNITED STATES PATENT AND TRADEMARK OFFICE
CERTIFICATE OF CORRECTION

PATENT NO. : 7,923,796 B2
APPLICATION NO. : 11/440030
DATED : April 12, 2011
INVENTOR(S) : Yutaka Shionoiri et al.

It is certified that error appears in the above-identified patent and that said Letters Patent is hereby corrected as shown below:

At column 18, line 4, please delete "and directly".

Signed and Sealed this
Twelfth Day of July, 2011

David J. Kappos
*Director of the United States Patent and Trademark Office*